United States Patent
Siefering et al.

(12) 
(10) Patent No.: US 6,221,781 B1
(45) Date of Patent: Apr. 24, 2001

(54) COMBINED PROCESS CHAMBER WITH MULTI-POSITIONABLE PEDESTAL

(75) Inventors: Kevin L. Siefering, Excelsior; Scott W. Hamre, St. Louis Park; Michael J. Foline, Carver, all of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/321,139

(22) Filed: May 27, 1999

(51) Int. Cl.[7] ................................................ H01L 21/00
(52) U.S. Cl. ...................... 438/704; 156/345; 438/706; 438/745
(58) Field of Search .................. 438/704, 706, 438/710, 716, 745; 156/345 L, 345 V, 345 WH, 345 MC

(56) References Cited

U.S. PATENT DOCUMENTS

| | | |
|---|---|---|
| 4,857,142 | 8/1989 | Syverson . |
| 4,903,717 | 2/1990 | Sumnitsch . |
| 5,169,408 | 12/1992 | Biggerstaff et al. . |
| 5,194,406 * | 3/1993 | Bok et al. .......................... 438/704 |
| 5,314,574 * | 5/1994 | Takahashi ............................ 438/706 |
| 5,492,566 | 2/1996 | Sumnitsch . |
| 5,513,668 | 5/1996 | Sumnitsch . |
| 5,762,751 * | 6/1998 | Bleck et al. ...................... 438/706 X |
| 5,820,692 | 10/1998 | Baecker et al. . |

FOREIGN PATENT DOCUMENTS

WO 97/03456   1/1997   (WO) .
WO 97/26457   7/1997   (WO) .

OTHER PUBLICATIONS

SEZ Company, Technology and Market, © SEZ.
Wet Master Series, © 1997, SEZ America 05/97.
Spin Ether Wet Master ® 202/203, Single Wafer Wet Processor, No. 004–1097.

* cited by examiner

*Primary Examiner*—William Powell
(74) *Attorney, Agent, or Firm*—Faegre & Benson LLP

(57) ABSTRACT

A process chamber within which a wafer can moved between a transfer position, an etch position and a liquid application position with a single motion system. The process chamber is a spin-type apparatus including a rotatable chuck driven by a spin motor combined with a movable pedestal. The pedestal is preferably movable along with the chuck and the spin motor with a wafer supporting portion of the chuck located in an internal chamber that is defined by a rinse bowl portion of a lower chamber assembly that is sealingly connected to the top cover member. The pedestal is displaceable between any and all of its positions as driven by a single linear motion driving device. In a first position, the pedestal itself can also form an effective seal with the top cover member to create an etching chamber. In a transfer position, the pedestal can be positioned to provide access through a wafer transfer gate, such as by a robot. In a liquid application position, the chuck supports a wafer within a rinse bowl section of the internal chamber. The process chamber eliminates any need for opening and closing the internal process chamber by moving the top cover member. The method of processing a wafer utilizing the apparatus of the present invention is also described.

20 Claims, 9 Drawing Sheets

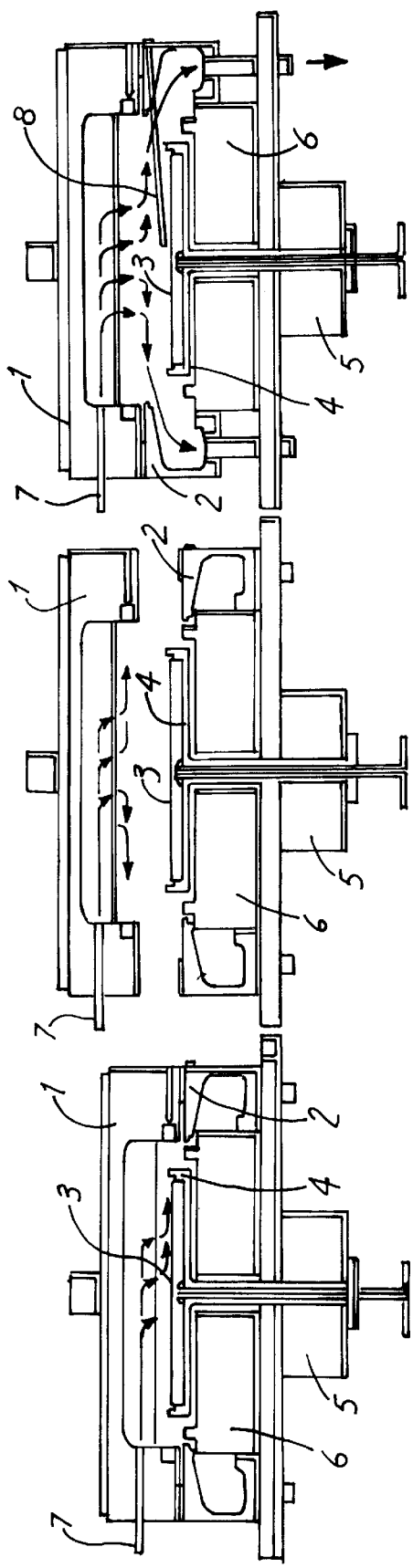

COMBINED PROCESS CHAMBER WITH MULTI-POSITIONABLE PEDESTAL

TECHNICAL FIELD

The present invention relates to wafer processing equipment and methods, in particular for processing semiconductor wafers, and is specifically directed to such processing equipment having a process chamber within which a support pedestal is provided to position the wafer differently for plural operations. The present invention is more specifically directed to a combined vapor phase/liquid phase application processing chamber.

BACKGROUND OF THE INVENTION

Wafer-type devices may be processed in a number of ways for the purpose of adding and/or removing materials to the surface of the wafer. Specifically, coatings may be applied selectively or over the entire wafer surface, and material may be uniformly or selectively removed instead of being applied or in addition to it. In particular, selective removal may be done in accordance with a predetermined pattern to provide specific surface features. The present invention was developed for its specific application in processing semiconductor wafers. Semiconductor wafer processing typical includes the application of coating materials in layers on the wafer substrate and/or the selective removal of material by an etching process.

Wafer etching typically requires that the surface of a wafer (including any number of coating layers) be exposed to an etchant, such as may comprise any of various known chemicals, including a number of acids. If the etchant is provided in the form of a gas, the etching technique is considered a dry or vapor phase processing technique. If, on the other hand, the etchant is provided as a liquid, the technique is characterized as a wet processing technique. Furthermore, in some cases, it is desirable to rinse the wafer surface after etching so as to remove soluble residues from the surface of the wafer. Specifically, it is known to use a wet etching process combined with a wet rinsing operation. Similarly, vapor phase etching and cleaning techniques have also been used together.

Moreover, the assignee of the present invention has commercialized certain vapor phase etch/wet rinse process systems, which cleaning systems have been commercially available under the trade name EXCALIBUR®, including a multi-vapor processor (MVP) and an in-situ rinse processor (ISR). An advantage of the Excalibur system chamber is that both the vapor phase etching and wet rinsing can be conducted within a single process chamber. That is, it is not required that the vapor phase etching be done is a first chamber followed by the transfer of the wafer into a second chamber for conducting the wet rinsing.

Specifically, as shown in the FIGS. 1, 2, and 3, an etch position, a transfer position, and a rinse position are schematically illustrated within a single process chamber in that respective order. The process chamber basically comprises a chamber bell 1 and a lower chamber assembly 2. A wafer 3 is supported on a rotatable chuck 4 that is driven by a spin motor 5. The lower chamber assembly 2 is also relatively movable with respect to a pedestal 6 that rotatably supports the chuck 4. A gas inlet line 7 permits the introduction of gas into the internal cavity of the system chamber, and a liquid inlet conduit 8 facilitates dispensing rinse liquid on the wafer surface after etching. The dispensed liquid can collect in the rinse bowl section of the internal chamber so as to exit from the internal chamber though appropriate drains.

The operation between the etch, transfer and rinse positions of the Excalibur system chamber is based upon two different relative movements. The first movement is the relative movement between the chamber bell 1 and the lower chamber assembly 2. The second movement is the relative movement between the pedestal 6 and the lower chamber assembly 2. In the illustrated system, the chamber bell 1 moves with the lower chamber assembly 2 during this second movement.

For operation, a wafer 3 is loaded onto the rotatable chuck 4 while in the transfer position that is illustrated in FIG. 2 where the chamber bell 1 is separated from the lower chamber assembly 2. This loading can be conducted by a known robotic system that can move a wafer in and out of the process chamber and set it down on the chuck 4 (i.e. a robot with three axis movement). As also shown in FIG. 2, gas, such as nitrogen, may be introduced at this time though the gas inlet line 7 for system purging and to maintain a clean gas environment near the wafer 3. Then, for etching, the chamber bell 1 is moved to a position against the lower chamber assembly 2. Between them, a fluoropolymeric o-ring is provided to generate a seal between the chamber bell 1 and the lower chamber assembly 2. In particular, a driver, such a pneumatic pancake cylinder, provides a first motion system that moves the chamber bell 1 against the lower chamber assembly 2 so as to provide a sufficient crush force to create a efficient seal. As shown in FIG. 1, etchant gas can be then introduced though the gas inlet line 7 to perform the etching operation in accordance with known vapor phase etching process techniques. Note also that in the FIG. 1 etch position the rinse bowl section of the internal chamber is substantially closed from the etching portion of the internal chamber by way of the interaction of pedestal 6 and the lower chamber assembly 2. Thus, the etching portion of the internal chamber is substantially isolated during the etching operation from the rinse bowl section where droplets of rinsing fluid may still be present on the rinse bowl surfaces from a prior rinsing operation. The desire to isolate the etching and rinse bowl sections from one another depends on the etchant used, machine thoughput requirements, and wafer application process tolerances. After etching, the rinse operation is conducted by raising the chamber assembly (comprising the chamber bell 1 and the lower chamber assembly 2) while leaving the wafer chuck 4 at the same elevation, thus effectively lowering the wafer 3 to a rinse position within the rinse bowl section of the internal chamber. Thus, rinsing liquid, such as water, can be dispensed onto the wafer via the liquid inlet conduit 8, and it can leave the internal process chamber though its rinse bowl section that leads to drains. By positioning the wafer in the rinse position, the rinsing liquid can be dispensed on the wafer with minimal exposure of the liquid to the internal walls of the etching portion of the internal process chamber. Clean gas is also provided though the gas inlet line 7 during the rinsing operation for purging any gas etchant remaining in the internal chamber along with the rinsing liquid though the drains. Once the rinse operation is complete, the lower chamber assembly 2 can be lowered relative to the pedestal 6 so as to position the wafer 3, once again, in the transfer position of FIG. 2, where it is again accessible by the system robot. The lower chamber assembly 2 is movable by a second motion system, such as may comprise another pneumatic cylinder. The lower chamber assembly 2 may be lowered with the chamber bell 1 followed by the chamber bell 1 being subsequently raised to the transfer position. Or the lower chamber assembly 2 may be lowered while the chamber bell 1 is maintained in an up position so as to make the transfer position.

Another similar system has also been developed by the assignee of the present intervention, and this system is described in U.S. Pat. No. 5,820,692 granted on Oct. 13, 1998 to Baecker et al. In this system, wafers are transferable into and out of the system chamber while being surrounded within a vacuum chamber. Also, the relative movement between the pedestal and the lower chamber assembly is effected by moving the pedestal up and down while maintaining the lower chamber assembly in a fixed position. A chamber bell is opened and closed by a first cylinder while the pedestal moves the wafer supporting chuck between the etch position and a rinse position as driven by a second cylinder assembly. The transfer position is defined by lifting the chamber bell from the lower chamber assembly. So, a seal is also provided for sealing the chamber bell to the lower chamber assembly under a crush force of the first cylinder to define an etching portion of the process chamber.

Although each of the systems described above provide effective means for etching and rinsing wafers without each operation negatively affecting the other, two motion systems are required. The use of such plural motion systems requires that significant alignment structure and adjustment features be provided to assure accurate alignment and proper definition of the etching and rinse positions. Moreover, by utilizing a chamber bell that is openable and closable, not only must a seal be provided between them, the first motion means must be precisely controlled and capable of a force of sufficient magnitude to create a crush force for making an effective seal. This sealing ability can change over time because of repetitive crushing of the O-ring and exposure thereof to the environment. Occasional adjustment of the first motion means and/or replacement of the O-ring might be required.

Also, removing the chamber bell completely from the lower chamber assembly to permit wafer transfer opens the entire internal process chamber to the air of the surrounding environment. Thus, surrounding air that may not be controlled sufficiently for temperature and humidity content, for example, might adversely affect the process operations. No matter how effectively the internal process chamber conditions are controlled by the system, opening the internal process chamber completely can introduce a variable into the process. Moreover, fully opening the internal process chamber increases the likelihood that chemical vapors (such as etchant vapors) may be emitted into the surrounding environment.

SUMMARY OF THE INVENTION

The present invention overcomes the disadvantages and shortcomings of the prior art by providing a process chamber within which a wafer can moved between a transfer position, an etch position and a liquid application position with a single motion system. Moreover, the process chamber can be closed by a top cover member that need not be opened and closed to permit wafer transfer so that the need to provide a resealable connection between them is eliminated. Instead, a wafer transfer opening or slot through the chamber side wall can be opened and closed by a sealable gate, where the opening can be sized to accommodate the wafer and any robot transfer ability. Thus, a permanent seal can be maintained between the lower chamber assembly and the top cover member, or they can be made integrally with one another.

A process chamber in accordance with the present invention comprises a spin-type apparatus including a rotatable chuck driven by a spin motor combined with a movable pedestal. The pedestal is preferably movable along with the chuck and the spin motor with a wafer supporting portion of the chuck located in an internal chamber that is defined by a rinse bowl portion of a lower chamber assembly that is sealingly connected to the chamber bell. The pedestal is preferably movable by a single motion system in a linear manner. That is, the pedestal preferably is displaceable between any and all of its positions as driven by a single linear motion driving device. In a first position, the pedestal itself can also form an effective seal with the top cover member to create an etching chamber. In a transfer position, the pedestal can be positioned to provide access through a wafer transfer gate, such as by a robot. In a liquid application position, such as for example rinsing, the pedestal supports a wafer within a rinse bowl section of the internal chamber, which is preferably sufficiently located away from the chamber bell and the thus the etching chamber portion of the internal chamber.

By the process chamber of the present invention, the need for opening and closing the internal process chamber by moving the top cover member is eliminated. This greatly reduces the complexity of the process chamber and eliminates a number of elements within the prior art apparatuses. Furthermore, using a sealable transfer opening or slot that is sized to facilitate wafer transfer instead of completely opening the top cover member greatly reduces the exposure of the internal process chamber to air of the surrounding environment. This minimizes any introduction of an environmental variable (such as a temperature or humidity change) into the internal process chamber that may affect a process operation. Likewise, the surrounding air is less likely to be exposed to chemical emissions from the internal process chamber.

Moreover, accurate alignment of the single motion system to the pedestal is all that is required for accurate alignment and definition of each of the appropriate pedestal positions. The seal between the top cover member and the lower chamber assembly never needs to be opened between operations. This also eliminates adjustments that were necessary in prior art process chambers to properly set the o-ring crush. By preferably using a linear drive means as the single motion system to move the pedestal between positions, the pedestal can be moved and stopped anywhere within the linear drive device's range of movement so as to be capable of creating different transfer, etch and liquid application positions, or other positions for a particular application. Stop positions can be provided in either or both of the upper and lower extremes of the pedestal movement, and/or stops may be defined as programmable positions of a control system that operates the linear drive device. Furthermore, the pedestal can be moved by the linear drive device so as to assist in dropping a wafer onto the end effector of a robot. That is, the robot may be provided without vertical motion because the pedestal can instead be lowered from the wafer.

The aforementioned advantages in accordance with the present invention can be achieved by a wafer processing apparatus having an internal process chamber within which a wafer can be supported at multiple positions, the apparatus comprising a support; a process chamber operatively connected with the support and comprising a rinse bowl member that provides a chamber bottom, a top cover member that provides a chamber top and a wall between the rinse bowl member and the top cover member that surrounds an internal process chamber, the wall also including a wafer transfer opening to permit a wafer to be selectively loaded into and removed from the internal process chamber, and the rinse bowl member having an access opening. Within the internal process chamber, a wafer support chuck is rotatably supported, the support chuck also being operatively connected with a rotatable drive device and being displaceable in a first direction, the support chuck thus being positionable within the internal process chamber in multiple positions between the top cover member and the rinse bowl member of the process chamber, and a first motion drive device is provided that is operatively connected to the support and which is further operatively connected with the wafer support chuck to drive the wafer support chuck between multiple different positions within the internal process chamber.

The wafer processing apparatus preferably also includes a pedestal comprising a base portion and an extension portion, the base portion being also located within the internal process chamber and the extension portion being displaceable with respect to the access opening of the rinse bowl member so that the base portion can also be positioned at multiple positions between the top cover member and the rinse bowl member of the process chamber. The wafer support chuck is preferably operatively rotatably supported along with the pedestal so as to move with the pedestal.

The aforementioned advantages in accordance with the present invention can also be achieved by method of processing a wafer utilizing the apparatus of the present invention.

BRIEF DESCRIPTION OF THE DRAWINGS

FIG. 1 is a schematic side view of a prior art wafer processing system chamber including a wafer support chuck driven by a spin motor within an internal chamber defined by a top cover member and a lower chamber assembly, wherein the top cover member and lower chamber assembly are positioned relative to the wafer support chuck to define an etch position of the system chamber;

FIG. 2 is a schematic side view of the prior art wafer processing system chamber of FIG. 1, wherein the top cover member is lifted from the lower chamber assembly to define a wafer transfer position of the system chamber;

FIG. 3 is a schematic side view of the prior art wafer processing system chamber of FIG. 1, wherein the top cover member and the lower chamber assembly are together lifted relative to the wafer support chuck to define a wafer rinse position of the system chamber;

DETAILED DESCRIPTION OF THE INVENTION

Figure 4:
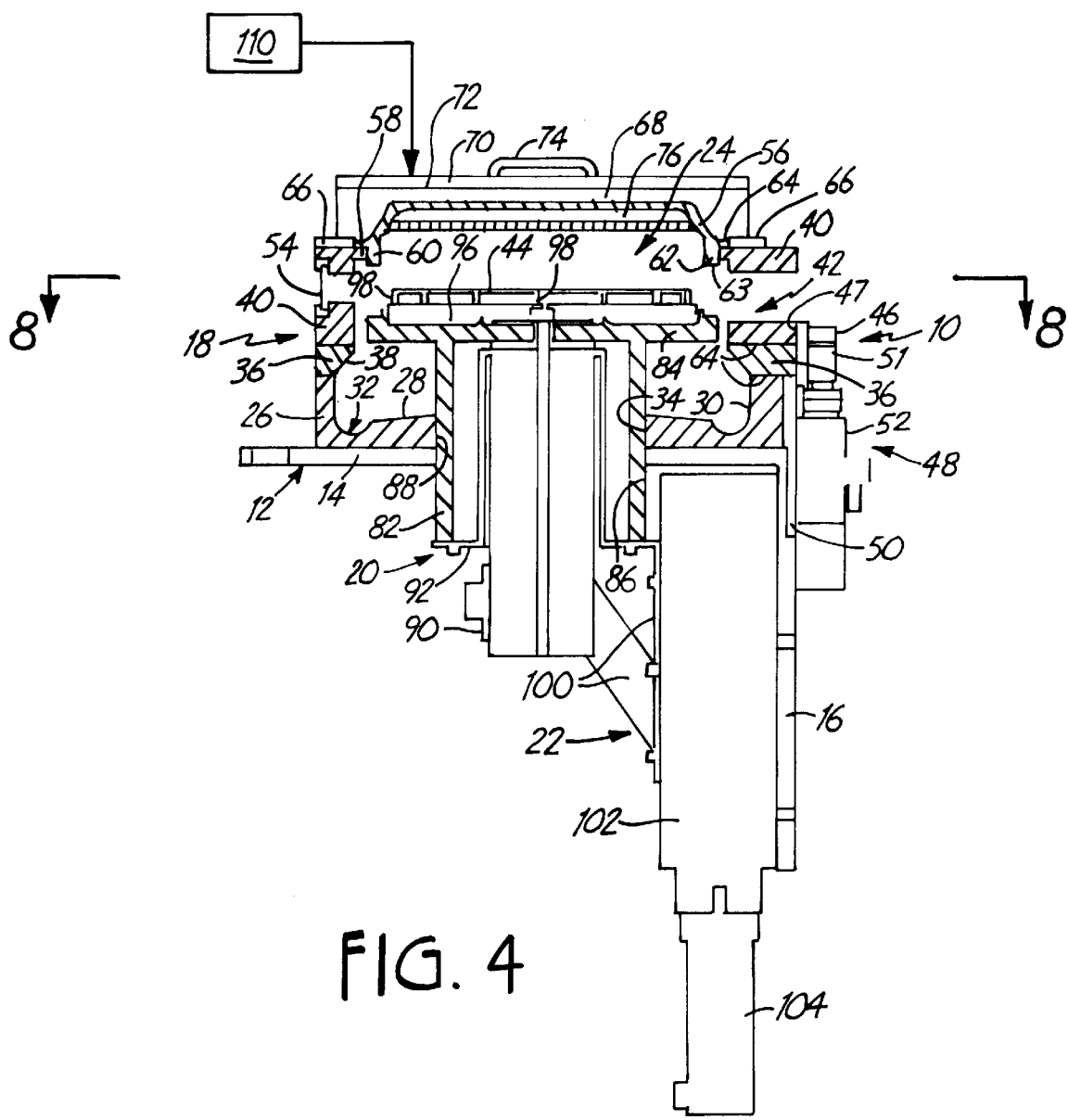
FIG. 4 is a side view of a wafer processing system chamber in accordance with the present invention including a rotatable wafer support chuck positioned within an internal process chamber that is defined by a top cover member and a lower chamber assembly that are fixed to one another, wherein the wafer support chuck is movable with a support pedestal that is connected with a drive device, and the wafer support chuck and the pedestal are illustrated in a wafer transfer position with a wafer transfer gate in an open position.

With reference to the drawings, wherein like components are labeled with like numerals throughout the several Figures, a wafer processing system chamber 10 is illustrated that is mounted to a support structure 12. The support structure 12 may itself comprise any structure capable of supporting the wafer process system chamber 10 in a desired position. Preferably the support structure 12 can position the wafer processing system chamber 10 so that a wafer can be supported substantially horizontally therein for spin processing. As shown, the support structure 12 includes a horizontal portion 14 and a vertical portion 16, where the support structure 12 would be further connected to additional support structure (not shown), such as a cabinet frame or other work area.

The wafer processing system chamber 10 is made up of a chamber defining portion 18, a rotatable wafer support section 20 and a drive mechanism 22. The rotatable wafer support section 20 is operably connected to the drive mechanism 22 so that certain parts of the rotatable wafer support section 20 are also movable between multiple positions inside of an internal process chamber 24 that is defined by the chamber defining portion 18.

As part of the chamber defining portion 18, a rinse bowl 26 is positioned on and preferably fixed to the horizontal section 14 of the support structure 12. The rinse bowl 26 defines the lower portion of the internal process chamber 24 in that it includes a bottom 28 surrounded by a upwardly extending perimetric wall 30. The shape in top plan view of the rinse bowl 26 is not critical, but, it is preferably somewhat circular to facilitate processing by and draining of process fluids. At the juncture of the bottom 28 and the perimetric wall 30, a gutter 32 is preferably formed for collecting and channeling liquid (any process liquid that is applied, such a rinse liquid) during processing and for leading such liquid to any number of drains (not shown) provided though the bottom 28. The bottom 28 also includes an access opening 34 for slidably permitting movement of the rotatable wafer support section 20, as will further discussed below.

A deflector ring 36 is preferably mounted atop the perimetric wall 30 of the rinse bowl 26 so as to not only extend the perimetric wall 30 upward, but also to provide a deflector surface 38 for the purpose of directing process liquids downward toward the gutter 32 during a liquid application processing step, described below. The deflector ring 36 also preferably follows the perimetric shape of the rinse bowl 26.

Figure 5:
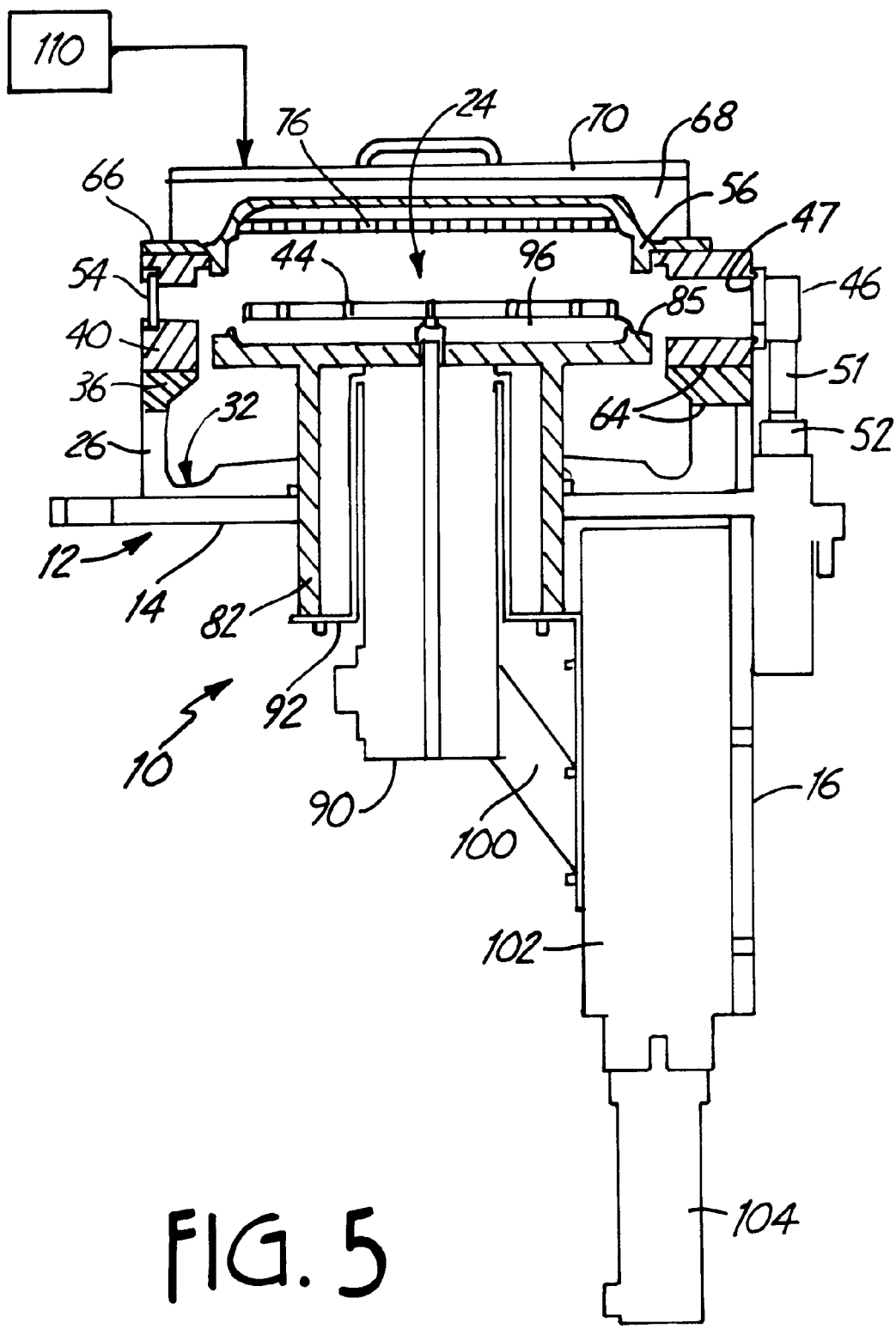
FIG. 5 is a side view of the wafer processing system chamber shown in FIG. 4, wherein the wafer support chuck is movable with the support pedestal by the drive device, and the wafer support chuck and the pedestal are illustrated in a wafer transfer position with a wafer transfer gate in a closed position.

As a further extension of the perimetric wall, a transfer ring 40 is positioned on top of the defector ring 36. The transfer ring 40 again preferably follows the same general shape of the perimetric wall but defines at its front side a wafer transfer slot 42 though which a wafer 44 can be inserted or removed from within the internal process chamber 24. The size and shape of the wafer transfer slot 42 should be suitable to accommodate the wafer or wafer-type object that is to be process according to the desired application and to accommodate the transfer of the wafer in or out of the internal process chamber by a transfer robot (such as, its end effector and possibly a portion of the robot). The front side of the transfer ring 40 though which the wafer transfer slot 42 is defined and the front surface of the defector ring 36 and rinse bowl 26 are preferably flattened so as to provide an area to facilitate the mounting and movement of a wafer transfer gate 46. That is, the area around the wafer transfer slot 42 is preferably shaped to permit the movement and positioning of the wafer transfer gate 46 in its opened and closed positions as illustrated in FIGS. 4 and 5 respectively. As the wafer transfer gate 46 is closed, a sealing surface of the wafer transfer gate 46 moves from over the flattened area to be positioned over the wafer transfer slot 42. The wafer transfer gate 46 is appropriately sized, so as to completely cover the wafer transfer slot 42 in the closed position thereof. To make a better sealed closure, a seal 47 is preferably provided around the perimeter of the wafer transfer gate 46 so as to surround the wafer transfer slot 42 in the closed position of the wafer transfer gate 46. Such a seal 47 can comprise any conventional or developed seal material that permits the sliding motion and provides a sufficient seal. A preferred material is a fluoropolymer elastomer, such as the material that is commercially available from Greene Tweed and Company under the trade name Chemraz™.

Figure 9:
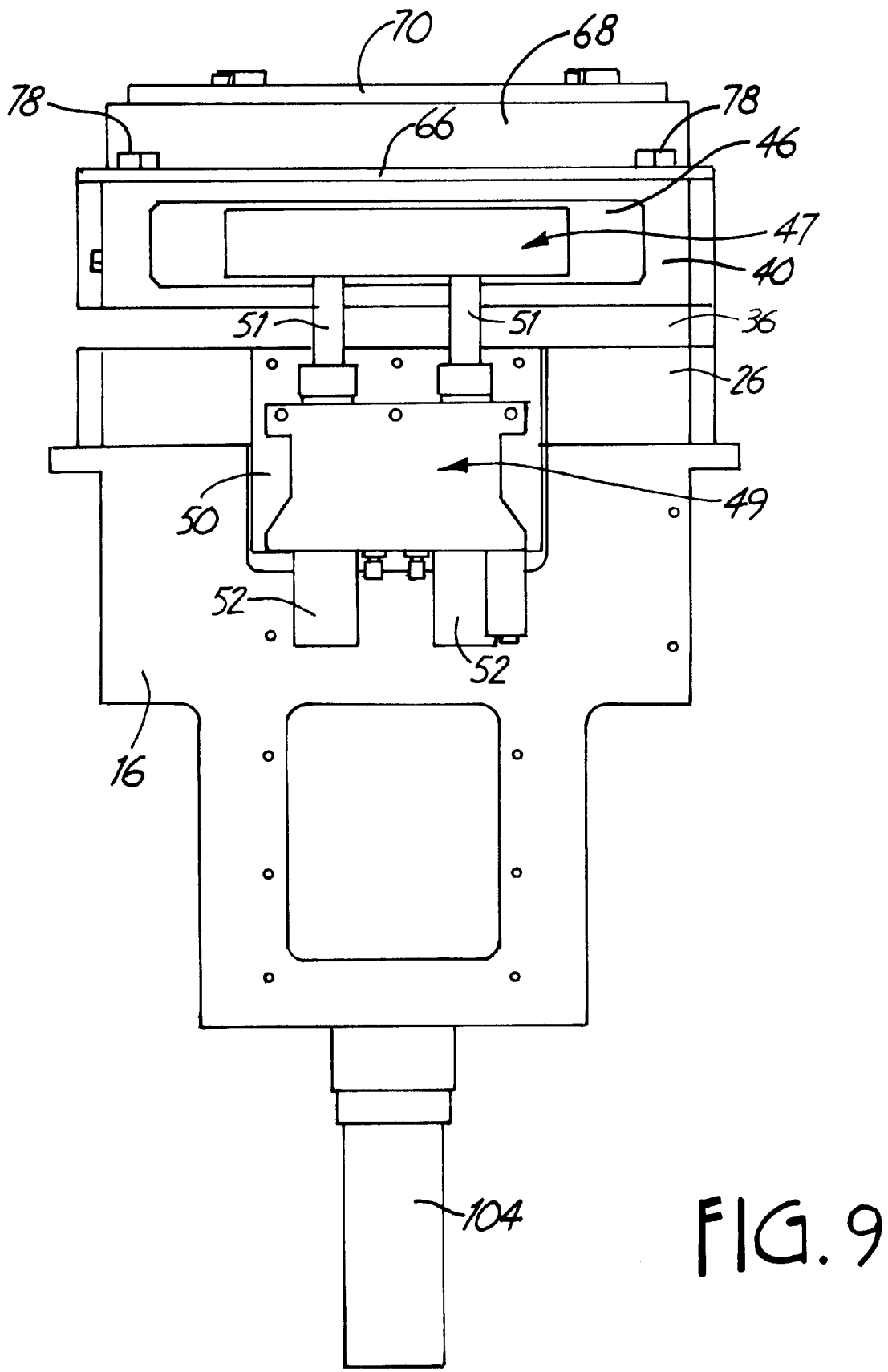
FIG. 9 is a front view of a wafer processing system chamber in accordance with the present invention showing a gate mechanism for opening and closing the wafer transfer gate in its closed position.
Figure 10:
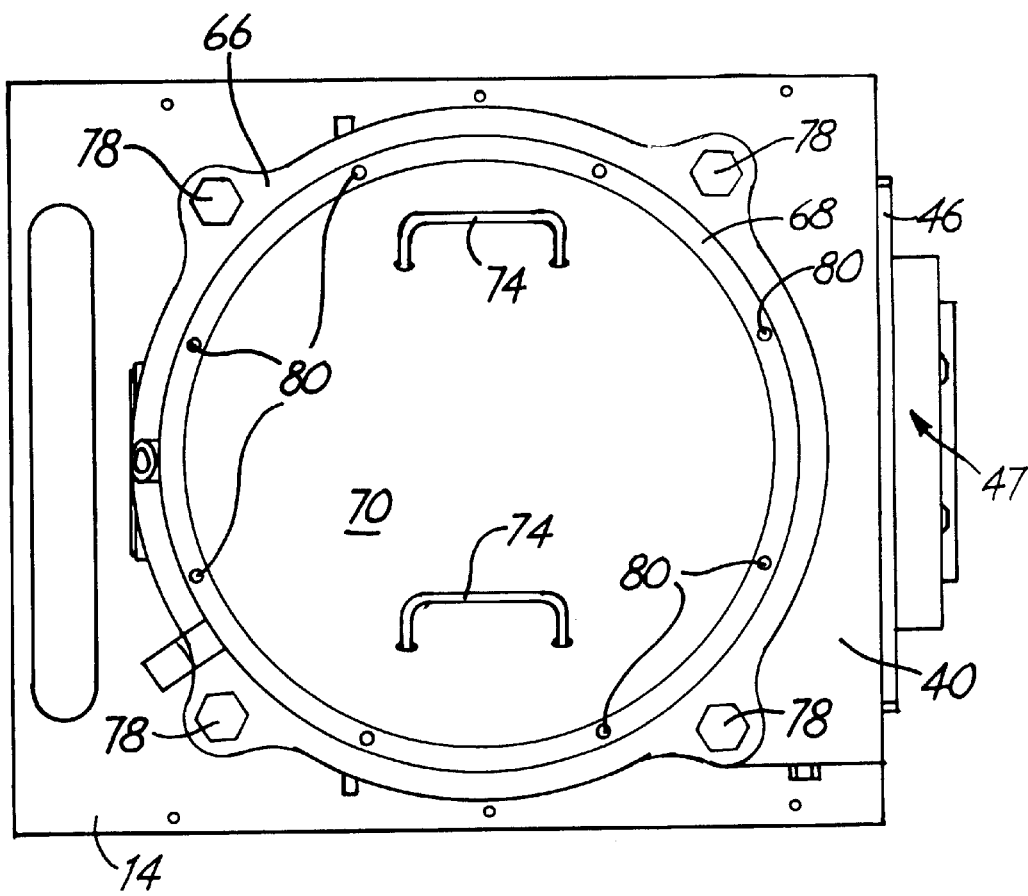
FIG. 10 is a top plan view of a wafer processing system chamber in accordance with the present invention.

To move the wafer transfer gate 46 between opened and closed positions, a gate mechanism 48 is preferably mounted to the rinse bowl 26 by way of a mounting plate 50. The mounting plate 50 is also preferably connected with the vertical portion 16 of the support structure 12 so as to further tie the chamber defining portion 18 with the support structure 12 for stability. As shown in FIG. 9, the gate mechanism 48 preferably includes a first drive device 47 for moving the wafer transfer gate 46 to cover the wafer transfer slot 42 and a second drive device 49 for urging the sealing surface, and thus the seal 47, of the wafer transfer gate 46 against the outer surface of the transfer ring 40 about the wafer transfer slot 42. The first and second drive devices 47 and 49 of the gate mechanism 48 preferably each comprises one or more pneumatic cylinders, although other mechanical, electrical, pneumatic and hydraulic devices are contemplated. For each drive device 47 or 49, such pneumatic cylinders (not illustrated in the case of drive device 47) should be mounted so as to move together under the influence of a common control system (not shown) so that they extend and retract together. Two cylinders 52 are illustrated in FIG. 9 for the drive device 49, and three such cylinders 9 (not shown) are preferably used for the drive device 47. The manner of controlling the extension and retraction of the cylinders can comprise any control system that can be designed in accordance with well know pneumatic system design criteria. For other types of drive devices, control systems for them are also well known. Ends of the extendible and retractable pistons 51 of the cylinders 52 of the second drive device 49 are preferably attached to the wafer transfer gate 46 so that by extension of the cylinders 52 together, the wafer transfer gate 46 is moved over the wafer transfer slot 42. Then, by extension of the cylinders of the first drive device 47, the wafer transfer slot can be fully closed and sealed. Retraction of the cylinders of the first drive device 47 unseals and moves the wafer transfer gate away from the wafer transfer slot 42, and subsequent retraction of the cylinders 52 causes the wafer transfer gate 46 to move to the fully opened slot position. The gate mechanism 48 may be controlled by any conventional or developed technique that can be used to correctly position the wafer transfer gate 46 in its closed and fully opened positions. Suitable pneumatic cylinders usable in the gate mechanism 48 include those commercially available from VAT Company of Switzerland.

The transfer ring 40 also preferably includes at least one viewing window 54 mounted within an opening that is provided through the transfer ring 40. Viewing windows, in general, are known to be used within process chambers, which windows may be made of conventionally known sapphire and can be mounted in a conventional sealing manner. Any number of such viewing windows 54 can be provided. Moreover, it is preferable that a pair of additional small sapphire optical windows (not shown) be sealingly provided through the wall of the transfer ring 40 that are positioned in a predetermined spots so that a laser can be used for checking the positioning of a wafer 44 within the internal process chamber 24. To do this, a first small optical window would be positioned to permit passage of light energy of a laser beam from a laser generator that would be located outside system chamber 10. A photo-detector would also be located outside the system chamber 10 and positioned so that the laser beam (after being bounced off of a wafer surface) would then pass through the second small optical window to the photo detector. The use of a laser and detector for determining wafer alignment is well known. In the past, they would normally be positioned outside of the internal process chamber, but they would be controlled to conduct such laser alignment measurement when the internal process chamber was open, i.e. when there was an unobstructed optical path for the laser system to function. Such a system disadvantageoulsy added more time to the process cycle time. However, with the above arrangement, accurate wafer positioning can be checked from outside the internal processing chamber 24, and the alignment measurement can be conducted while the internal process chamber 24 is being purged with gas, as is described more below.

To close off the top of the internal process chamber 24, a top cover member 56, which is illustrated as a chamber bell, is fixed atop of an inner perimetric portion of the transfer ring 40. The top cover member need not be of any particular shape as to either its outside shape or inside shape. The outside shape can be similar to or different from the internal shape, and the wall portions thereof could be angled (as illustrated) or not and/or could comprise other features that have linear, curved or compound surfaces. In some cases, the top cover member can be very simply provided, particularly when the added features provided with the top cover member, discussed below, are not desired. Preferably, as illustrated, a perimetric flange 58 sits on the top inner surface of the transfer ring 40 and a downwardly depending portion 60 lies just inside the opening that is defined by the top of the transfer ring 40. The perimetric flange 58 thus supports the top cover member 58 in position vertically, and the downwardly depending portion 60 provides a lower surface 62 that facilitates another perimetric seal, such as comprising a perfluoro-elastomer O-ring 63 for the purpose of which will be described below.

Additional seals 64 are preferably located in between the flange 58 and the top surface of the transfer ring 40, the bottom surface of the transfer ring 40 and the top surface of the defector ring 36, and the bottom surface of the defector ring 36 and the top surface of the rinse bowl 26. These seals 64 can be any known or developed seal device or material, such as conventionally known spring energized or perfluoroelastomer seals. The seals 64 are provided so that the internal process chamber 24 can be substantially sealed from the outside environment when the wafer transfer gate 46 is closed.

A strapping plate 66 is also preferably provided on top of and all the way around the transfer ring 40, but is sized to lie outside of the flange 58 of the top cover member 56. On top of the strapping plate 66, a heat sink 68 is further preferably provided that is sized and shaped to lay against the external surface of the top cover member 56 and partially over the strapping plate 66. On top of the heat sink 68, a layer of installation 70 is also preferably provided that covers a thin heating element 72 provided on the top of surface of the heat sink 68. A handle 74 may also be attached to the top of the heat sink 68 for removal thereof when desired. The thin heating element 72 can be conventionally controlled so as to generate and transfer heat to the heat sink 68 that itself preferably comprises a good heat conductive material, such as metal, of which aluminum is preferred. Thus, heat can be substantially evenly spread throughout the heat sink 68 and thereby transferred to the top cover member 58 so that heat may be further transferred to within the internal process chamber 24 during wafer processing as described below.

A diffusion member 76 is also preferably mounted within the top cover member 56 by any conventional technique for the purpose of facilitating spreading of gas into the internal process chamber 24. Preferably, the diffusion member 76, when viewed in plan view provides a lattice or honeycomb type structure that supports a membrane laid across the diffusion member 76. The membrane may comprise any known or developed such material, but preferably comprises a teflon cloth, and the support portion of the diffusion member 76 may be machined or otherwise formed from any known or developed material, such as commercially available PPS plastic material.

Any number of gas inlet passages (not shown) may also be provided to pass through both the heat sink 68 and the top cover member 56 so as to provide one or more fluid passages that can be connected to gas supply lines for supplying gas into the internal process chamber 24, preferably at a point above the diffusion member 76. Also, a temperature monitoring device, such as a thermocouple or RTD probe, can be mounted at the interface of the heat sink 68 and the top cover member 56 to assist in more accurate temperature control within the internal process chamber 24. Preferably, such a temperature monitoring device would be located as close to the internal surface of the top cover member 56, but within the material of the top cover member 56, such as by providing it in a recess provided from the outside of the top cover member 56. That is, the temperature monitoring device can be provided sufficiently close to the internal process chamber 24 to conduct a temperature measurement and provide feedback information for controlling the thin heating element 72 to control the temperature within the internal process chamber 24.

In order to operably connect the rinse bowl 26 with the deflector ring 36 and the transfer ring 40, a number of bolts 78 (shown in the top view of FIG. 11), are provided to pass through the strapping plate 66, the transfer ring 40, the deflector ring 36 and the rinse bowl 26. These bolts 78 also preferably pass through the horizontal portion 14 of the support structure 12 so that not only are the rinse bowl 26, deflector ring 36, and the transfer ring 40 held together, they are also securely mounted to the support structure 12. Then, to also fixedly connect the top cover member 56 on top of the transfer ring 40, a number of screws 80 pass through the heat sink 68 and into the strapping plate 66. This action sandwiches the perimetric flange 58 between the heat sink and the top surface of the transfer ring 40 to thus hold the top cover member 56 securely and sealingly in place. It is contemplated that any conventional or developed mounting technique can be used to connect the rinse bowl 26, deflector ring 36, transfer ring 40, and the top cover member 58, as well as mounting the entire assembly onto the support structure 12. It is preferable, however, that the assembly be disassemblable for maintenance purposes.

The rotatable wafer support section 20 comprises a pedestal 82 having a base portion 84 and a slidable extension portion 86 that is sized and shaped to be easily movable within the access opening 34 through the bottom 28 of the rinse bowl 26. Preferably, the access opening 34 and the extension portion 86 are similarly shaped and a sliding seal 88 is mounted within the access opening 34 so that the internal process chamber 24 is sufficiently sealed. Since the pedestal 82 does not need to be rotatable, but only needs to be sealable with the access opening 34, the shape of the access opening 34 and thus the outer shape of the guide portion 86 need not be circular. Moreover, where the sealing of the internal process chamber 24 can be accomplished by other means, such as by using a bellows or bladder, the sliding seal would be unnecessary and the pedestal extension portion 86 would not have to be shaped and sized at all similarly to the access opening 34. There is no need for any guiding or alignment cooperation between the pedestal extension portion 86 and the access opening 34, since that function is provided by the mounting structure between the rotatable wafer support section 20 and the drive mechanism 22, described in detail below.

A rotary servo device, or spin motor 90 and the pedestal 82 are mounted to a spin motor mounting bracket 92. The spin motor 90 drives an output shaft 94 to support and provide rotary motion to chuck 96 comprising a disc-like portion mounted with the output shaft 94 and which supports a number of articulated centrifugally activated clamping devices 98 about its periphery. Each centrifugally activated clamping device 98 is pivotally mounted to the chuck 96 so that its top finger portion is movable toward and away from the center point of chuck 96 defined by its axis of rotation. Each centrifugally activated clamping device 98 also includes a weighted portion on opposite sides of each centrifugally activated clamping device's pivotal mounting than its finger portion, and each finger portion includes a horizontal surface and a vertical surface (not specifically shown). The centrifugally activated clamping devices 98 can be mounted by conventional pin devices so that during rotation of the chuck 96, the weighted portions tend to move away from the axis of rotation, causing the finger portions to move inwardly. By this construction, a wafer of appropriate size relative to the chuck design can be transferred into and placed on the horizontal portions of each of the centrifugally activated clamping devices together to support the wafer in non-spinning position. When the chuck 96 is rotated by the spin motor 90, the weighted portions of the centrifugally activated clamping devices move outwardly, causing the fingers to move inwardly so that they together grab the wafer by its edge and so that the wafer is no longer supported by any of the horizontal surfaces of the finger portions. This design is particularly beneficial in semiconductor wafer processing.

Figure 11:
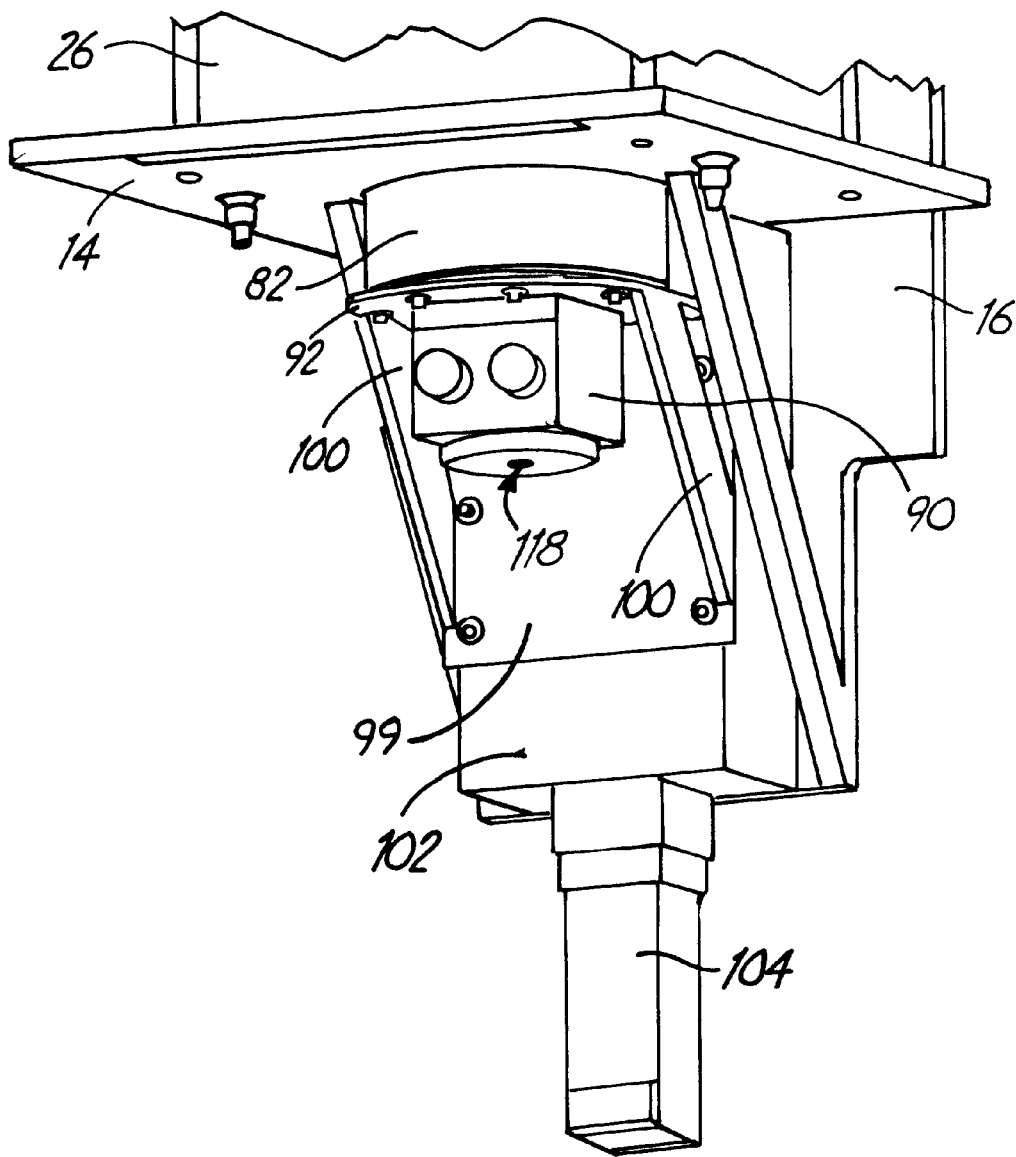
FIG. 11 is an oblique view of a wafer processing system chamber in accordance with the present invention showing a connection between the pedestal, a spin motor mounting bracket and the drive device.

With reference to FIG. 11, the drive mechanism 22 is operatively connected to the pedestal 82 by a plate 99 formed with or connected to strut portions 100 that are further integral with or connected to the spin motor mounting bracket 92 that extends inside of the pedestal 82, as shown in FIGS. 4–7. The drive mechanism 22 preferably comprises a linear drive device 102 that itself comprises a moving portion and a stationary portion. That is, the drive device 102 should be mountable by the portion thereof that is intended to be stationary while its moving portion is accessible to provide a driven output from the drive device 102. The stationary portion of the drive device 102 is thus preferably mounted to the vertical portion 16 of the support structure 12 and the movable portion of the drive device 102 is connected with the plate 99 so as to move the pedestal 82 and chuck 96 by way of the struts 100 and the spin motor mounting bracket 92. Preferably, the linear drive device 102 comprises a leadscrew and ball type slide device that is driven by another rotary servo or spin motor 104. Such leadscrew and ball slide mechanisms are well known in the art and are commercially available, such as from Daedal Company, so that the movable slide portion of the linear drive device 102 moves linearly as a direct and measured result of the rotary movement of a shaft driven by the spin motor 104. Any known or developed position sensing device may also be included, such as, for example limit switches to track linear movement, or encoders for tracking the linear movement by monitoring the rotary movement of the spin motor 104 or its driven shaft. The possible degree of linear movement is that defined by the entire range of movement of the particular linear drive device 102, although hard stops may instead limit the movement of the pedestal 82, such as where its surface 85 comes into contact with the surface 62 of the top cover member 56 to define the etch position.

By this construction, a single linear drive device 102 can accurately and definitely drive the pedestal 82 and chuck 96 within the internal process chamber 24 at any number of precise locations. That is, the single linear drive device 102 can define any number of positions within the internal process chamber 24. Moreover, by very accurately aligning the single connection between the slide of the linear drive device 102 with the pedestal 82, very accurate sliding movement can be effected.

The components of the wafer processing system chamber 10 of the present invention can comprise known or developed materials that are particularly suitable for any particular application of the system chamber 10. That is, materials that are of sufficient strength, chemical resistance, and cleanliness may be desirable depending on the particular application. In the case of a semiconductor wafer processing system, the material of the components defining the chamber portion 18 preferably comprise materials resistant to the etching gas and liquid solutions that are to be used. Moreover, all components are preferably made of materials suitable for use in a clean room environment. Suitable materials may include metals and plastics, of which it is preferable that the rinse bowl 26, deflector ring 36, transfer ring 40, top cover member 56, pedestal 82 and transfer gate 46 be comprised of PVDF plastic. Based upon the materials selected for the different components, any of the chamber components may be made integrally with other component parts, as desired. Specifically, since the top cover member 56 need not be separable from the rinse bowl 26, or the transfer ring 40 and/or the deflector ring 36 (as in the prior art chamber design), any and all of these components can be made integral with one another.

The operation of a complete cycle for a process that may be conducted in accordance with the present invention will now be described with reference to FIGS. 4–7. The described process will be a vapor phase etch/wet liquid application process that is suitable for use in the processing of a semiconductor wafer. It is, of course, contemplated that other different processes may be conducted in accordance with the present invention for processing other wafer-type devices.

Starting with FIG. 4, the chuck 96 is illustrated in a wafer transfer position with a wafer 44 loaded onto the fingers of centrifugally activated clamping devices 98. The wafer transfer gate 46 is shown in its open position permitting the wafer 44 to be transferred onto the chuck 96 via the wafer transfer slot 42. As above, this transfer may take place by a conventional robot utilizing an end effector. As one particular advantage of the present convention, an end effector can move the wafer into the internal process chamber 24 by movement in a single plane, and then the linear drive device 102 can be activated to move the pedestal 82 and the chuck 96 slightly upward to pick the wafer 44 off of the robot end effector. In other words, the robot need not have a z-(vertical) axis movement. During this time, clean gas such as nitrogen may be supplied from a supply 110 into the internal process chamber 24. FIG. 5 shows the system chamber 10 in substantially the same state as that of FIG. 4 with the pedestal 82 and chuck 96 in the wafer transfer position. However, the wafer transfer gate 46 is illustrated in its closed position with seal 47 effectively closing the internal process chamber 24.

Figure 6:
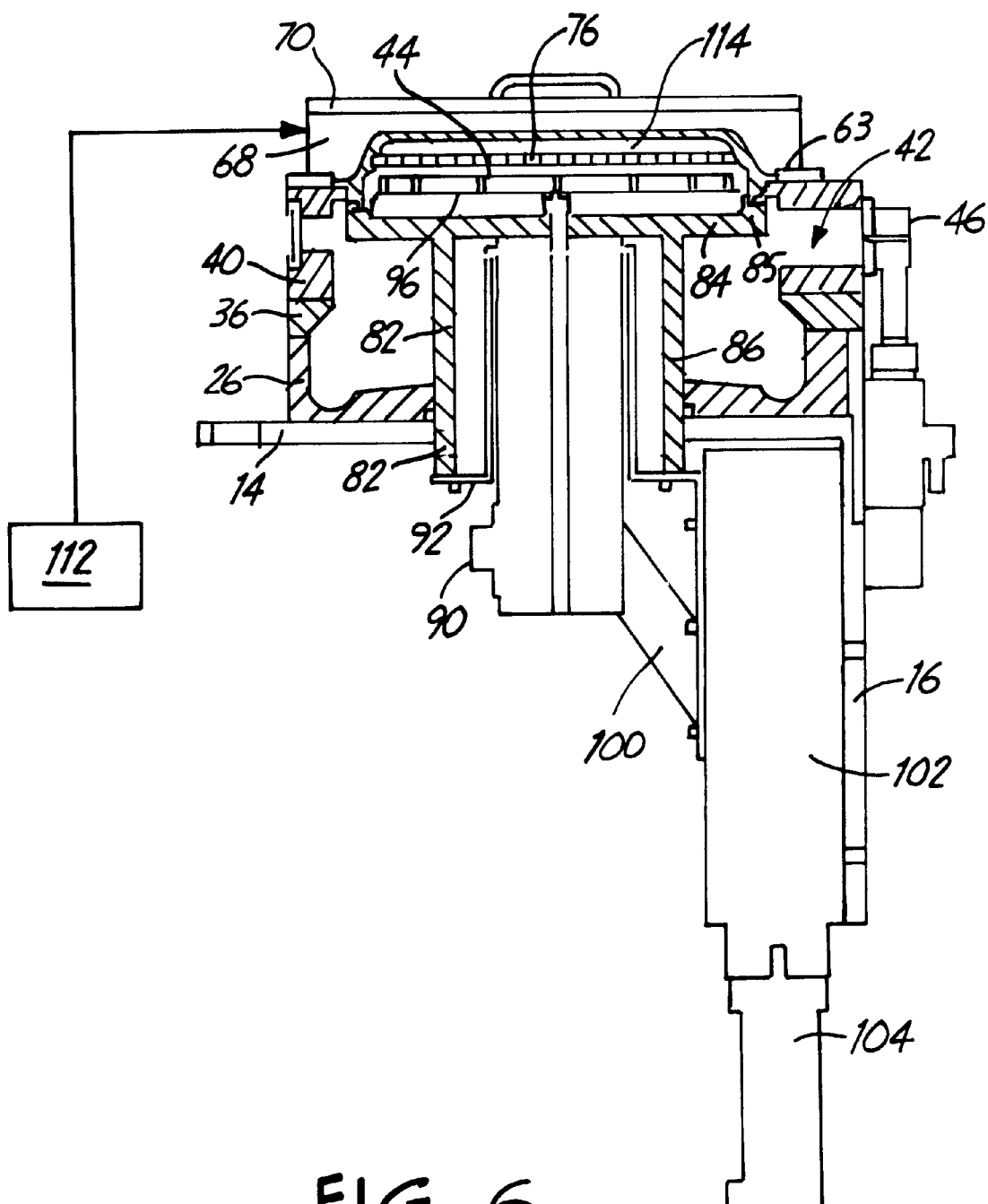
FIG. 6 is a side view of the wafer processing system chamber shown in FIG. 5, wherein the wafer support chuck is movable with the support pedestal by the drive device, and the wafer support chuck and the pedestal are illustrated in a wafer etch position with the pedestal forming an etching chamber with the top cover member.

Although a process operation could be performed on the wafer 44 while it is in the wafer transfer position of FIGS. 4 and 5, one specific etch position is illustrated in FIG. 6 where the pedestal 82 and chuck 96 are moved fully upward to a hard stop position where a seal surface 85 of the base portion 84 of pedestal 82 is positioned against the bottom surface 62 of the downwardly depending portion 60 of the top cover member 56. More specifically, the o-ring 63 effectively enhances the seal between surfaces 62 and 85. This position is preferred in semiconductor wafer processing as a vapor phase etch position where etching gas can be introduced from supply 112 into the etch chamber portion 114 that is now defined between the base portion 84 of pedestal 82 and the top cover member 56. Vapor phase etching preferably takes place while the pedestal 82 and chuck 96 support the wafer 44 in the illustrated position of FIG. 6. During this operation, heat may be provided into the internal process chamber 24 by the thin heating element 72 via the heat sink 68 and top cover member 56. Moreover, the amount of heat may be controlled by any number of sensing devices, such as a thermocouple device.

Figure 7:
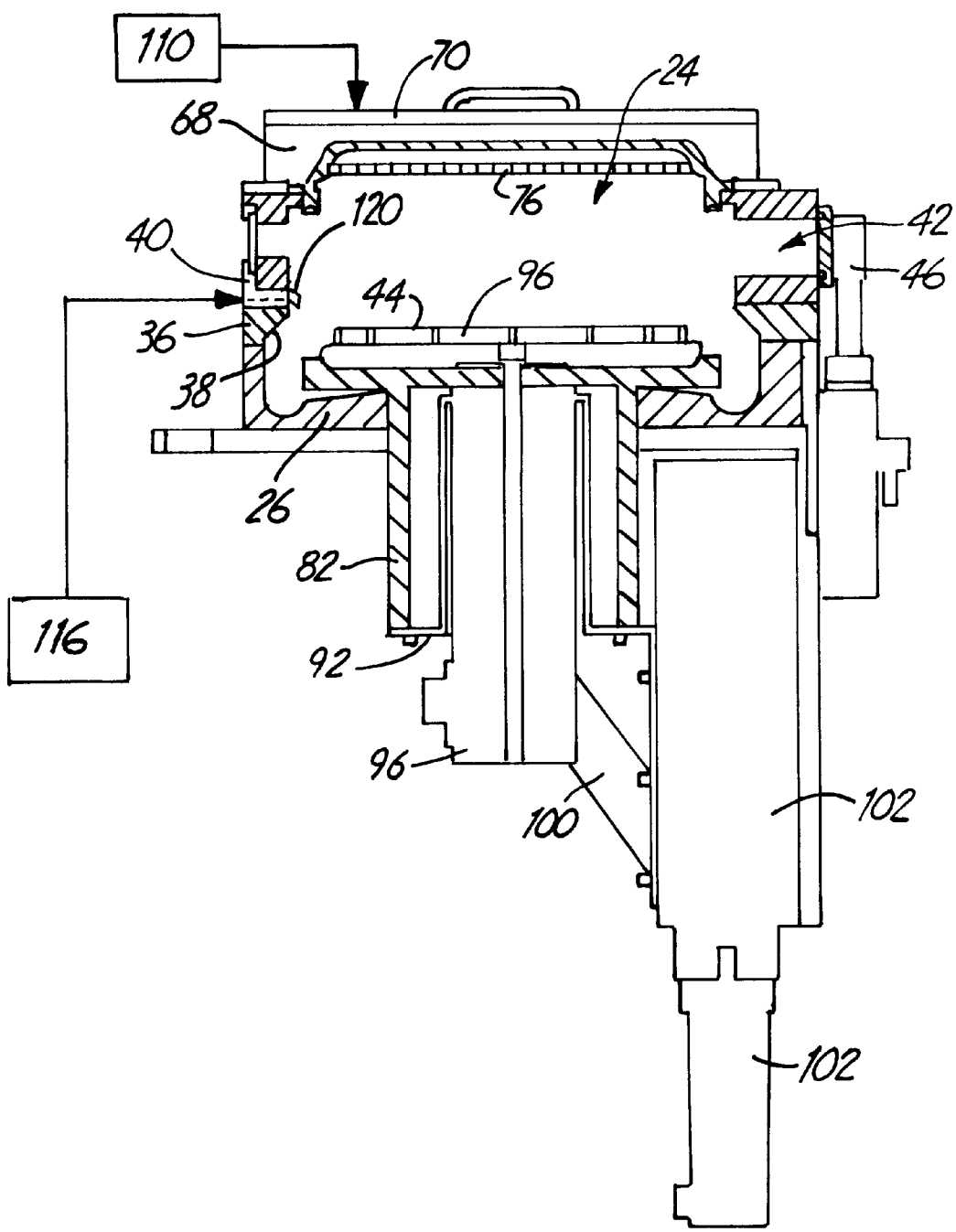
FIG. 7 is a side view of the wafer processing system chamber shown in FIG. 5, wherein the wafer support chuck is movable with the support pedestal by the drive device, and the wafer support chuck and the pedestal are illustrated in a liquid application position with the pedestal positioned within a rinse bowl section of the internal process chamber.
Figure 8:
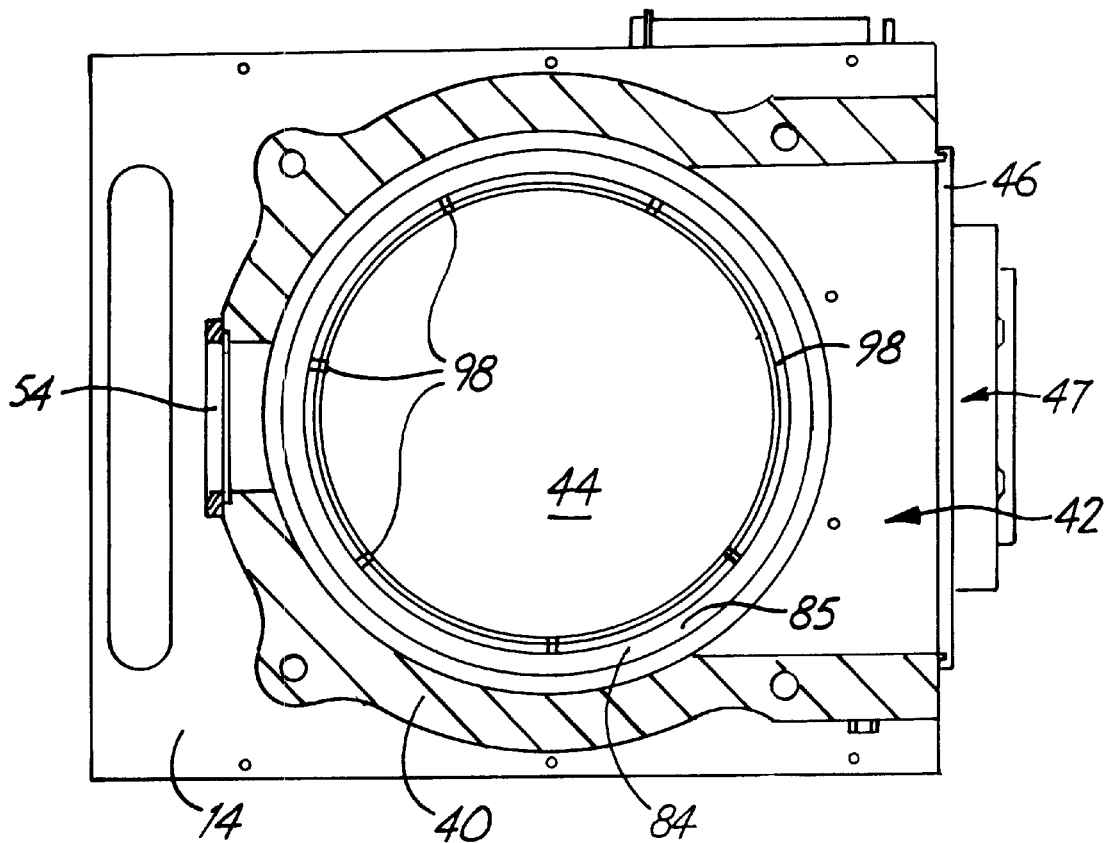
FIG. 8 is a cross-sectional view taken along line 8—8 of FIG. 4 showing a top plan view of a wafer supported on the rotatable wafer support chuck within the internal process chamber while in the wafer transfer position and with the wafer transfer gate in a closed position.

A liquid application position is illustrated in FIG. 7, which in the case of processing a semiconductor wafer, could take place before or after an etching step, such as illustrated in FIG. 6. The liquid that may be applied could be a rinse liquid or another type of process liquid or chemical solution based upon the desired application. The liquid application position is preferably defined by the pedestal 82 and the chuck 96 moved downward to its liquid application position, which may be defined as a sensed position or as a hard stop. The liquid application position need not be the fully down position, but may instead be defined at any point between the upper and lower hard stops that limit the movement of the pedestal 82. For liquid dispensing, a liquid, such as water, is supplied from a supply 116 so as to be dispensed onto the surface of wafer 44. A dispensing device 120, preferably comprising a PFA material tube of appropriate diameter can be located anywhere within the internal process chamber 24, such as by way of a passage provided through the transfer ring 40 as shown in FIG. 7, so long as it does not interfere with the other movements and as it is able to dispense the rinsing liquid onto the wafer surface. During this dispensing, the deflector surface 38 acts to deflect any sprayed liquid from the edge of wafer 44 downwardly and into the rinse bowl 26, and in particular to be collected in gutter 32 and to be removed by drains. During the rinsing operation, clean gas may also be supplied from gas supply 110 to purge any gas etchant from the chamber 24. The rinsing operation also preferably takes place while the chuck 96 is rotatably driven by its spin motor 90.

It is also contemplated that one or both of the etching and rinsing operations (or other process steps for other wafer-type products) may also be conducted on the wafer backside. These backside operations would preferably be conducted at the same time as the operations are performed on the topside surface. To do this, a multiple-fluid conduit 118 (see FIG. 11) can be extended through the shaft portion of chuck 96 so as to exit at the top of the shaft portion, just under the backside of the wafer 44. The inlet side of the conduit 118 can be appropriately connected to the requisite gas and liquid sources to support the functionality of the respective operations. In the case of semiconductor processing, three concentric tubes are preferred as the conduit 118, where the central line transfers the rinse liquid, such as water, the next outer line transfers the etchant, and the outer line transfers purge gas.

Also for semiconductor wafer processing, it is sometimes desirable to pre-rinse the wafer 44 prior to the etching operation whether or not the rinsing operation is conducted after the etching operation. This is easily facilitated by the apparatus of the present invention by simply controlling the system chamber 10 to do a pre-rinse step before etching. That is, the pedestal 82 and chuck 96 would be positioned in the liquid application position of FIG. 7 before the etching operation is conducted. The etching operation could then be done with the pedestal 82 and chuck 96 located as shown in FIG. 6. The subsequent rinsing step could be conducted as set out above.

When the operations to be performed are complete, the pedestal 82, chuck 96 and thus wafer 44 can then be repositioned in the wafer transfer position of FIG. 5. Then, the wafer transfer gate 46 can be opened, as shown in FIG. 4, to provide access to a robot end effector to remove the wafer 44. Like the loading operation, the robot can advantageously move only in the plane for it to slide under the wafer 44. The pedestal 82 and chuck 96 could then be slightly dropped so that the end effector can freely move the wafer 44 from within the internal process chamber 26. Of course, the robot itself may pick the wafer 44 from chuck 96 and remove it from the internal process chamber 24.

Any number of process steps can be conducted within the internal process chamber 24 in accordance with the present invention depending on the wafer or wafer-type product to be processed. Moreover, the order by which any particular process operation is conducted can be varied based upon any particular application. By the present invention, a position is defined that substantially segregates a portion of the internal chamber 24. Specifically, when the pedestal 82 is moved fully upward, the surfaces 62 and 85 provide the chamber portion 114 from the internal process chamber 24. In semiconductor wafer processing, this position may be utilized for vapor phase etching. Other process steps may be conducted at the wafer transfer position, at the lower liquid application position, or at any position between the limits of movement of the pedestal 82. As alternatives, a vapor phase etching process for a semiconductor wafer could be conducted with the wafer 44 in a transfer position, or in the liquid application position. For example, it may be desirable to etch the wafer 44 by vapor phase etching with the wafer 44 in a liquid application position so that it can be rinsed after etching or so that it can be etched after a pre-rinse step (if performed). In one case, wafer processing throughput might be key to a particular processing application, so it might be desirable to etch in the liquid application position. Where the process operations can all take place within the same chamber portion (e.g. in the liquid application position) the top cover member may be much less complex. For example, if etching is done in the liquid application position, there would be no need to have the pedestal 82 cooperate with the top cover member 56 to define an etch chamber portion. Likewise, the heating system might not be needed in any case. The top cover member might then comprise a simple member that merely serves to seal the top of the internal process chamber.

By utilizing a single linear drive device 102, any number of specific pedestal positions can be defined. The linear drive device 102 itself may comprise any known or developed drive device that can be mounted in a way to drive the pedestal 82 between its limits. Such devices may include mechanical, electrical, pneumatic, hydraulic, and other combination devices. A lead screw and ball type device is preferred because of its very accurate displacement ability. That is, by driving a lead screw with a spin motor 104, the pedestal 82 can be very accurately positioned. Moreover, the spin motor 104 may be controlled by any known means, such as including an encoder, so as to precisely mark those specifically defined positions. With other mechanical, pneumatic or hydraulic drive systems, multiple hard stops can be utilized with multiple cylinders or devices used in combination with one another. Other switches and sensors can be used with other drive mechanisms.

What is claimed is:

1. A wafer processing apparatus having a sealable internal process chamber within which a wafer can be supported at multiple positions, said apparatus comprising:

a support;

a process chamber operatively connected with said support and comprising a rinse bowl member that provides a chamber bottom, a top cover member that provides a chamber top and a wall between the rinse bowl portion and the top cover member that surrounds an internal process chamber, the wall also including a wafer transfer opening to permit a wafer to be selectively loaded into and removed from the internal process chamber, and the rinse bowl member having an access opening;

a wafer support chuck rotatably supported within the internal process chamber, the support chuck also being operatively connected with a first rotatable drive device and being displaceable in a first direction, the support chuck thus being positionable within the internal process chamber in multiple positions between the top cover member and the rinse bowl member of the process chamber;

a first motion drive device that is operatively connected to the support and which is further operatively connected with the wafer support chuck to move the wafer support chuck between multiple different positions within the internal process chamber.

2. The wafer processing apparatus of claim 1, further including a pedestal comprising a base portion and an extension portion, the base portion being also located within the internal process chamber and the extension portion extending through and movably displaceable with respect to the access opening of the rinse bowl member so that the base portion can also be positioned at multiple positions between the top cover member and the rinse bowl member of the process chamber.

3. The wafer processing apparatus of claim 2, wherein the wafer support chuck is operatively rotatably supported along with the pedestal so as to move with the pedestal.

4. The wafer processing apparatus of claim 3, further including a wafer transfer gate that is movably disposed with respect to the process chamber and which is movable between an opened position of the wafer transfer opening and a closed position of the wafer transfer opening.

5. The wafer processing apparatus of claim 4, wherein a first sealing surface portion of the base portion of the pedestal is engageable with a second sealing surface portion that is provided within the internal process chamber so as to seal off a portion of the internal process chamber when the pedestal and chuck are raised to an up position.

6. The wafer processing apparatus of claim 5, further including a transfer ring that is located between the top cover member and the rinse bowl member to provide at least a portion of the wall, where the wafer transfer opening is provided through the transfer ring, and the top cover member, transfer ring and the rinse bowl member are formed separately and are sealingly connected to one another.

7. The wafer processing apparatus of claim 6, wherein the first rotatable drive device is connected with the pedestal by a bracket, and the bracket is further connected with the first motion drive device for moving the first rotatable drive device and thus the chuck and the base portion of the pedestal between multiple positions between the top cover member and the rinse bowl member of the process chamber.

8. A combined vapor phase/liquid phase wafer processing apparatus having a sealable internal process chamber within which a wafer can be supported at multiple positions, said apparatus comprising:
   a support;
   a process chamber operatively connected with said support and comprising a rinse bowl member that provides a chamber bottom, a top cover member that provides a chamber top and a wall between the rinse bowl portion and the top cover member that surrounds an internal process chamber, the wall also including a wafer transfer opening to permit a wafer to be selectively loaded into and removed from the internal process chamber, and the rinse bowl member having an access opening;
   a wafer support chuck rotatably supported within the internal process chamber, the support chuck also being operatively connected with a rotatable drive device and being displaceable in a first direction, the support chuck thus being positionable within the internal process chamber in multiple positions between the top cover member and the rinse bowl member of the process chamber;
   a first motion drive device that is operatively connected to the support and which is further operatively connected with the wafer support chuck to move the wafer support chuck between multiple different positions within the internal process chamber.

9. The wafer processing apparatus of claim 8, further including a pedestal comprising a base portion and an extension portion, the base portion being also located within the internal process chamber and the extension portion extending through and movably displaceable with respect to the access opening of the rinse bowl member so that the base portion can also be positioned at multiple positions between the top cover member and the rinse bowl member of the process chamber.

10. The wafer processing apparatus of claim 9, wherein the wafer support chuck is operatively rotatably supported along with the pedestal so as to move with the pedestal.

11. The wafer processing apparatus of claim 10, further including a wafer transfer gate that is movably disposed with respect to the process chamber and which is movable between an opened position of the wafer transfer opening and a closed position of the wafer transfer opening.

12. The wafer processing apparatus of claim 11, wherein a first sealing surface portion of the base portion of the pedestal is engageable with a second sealing surface portion that is provided within the internal process chamber so as to seal off a portion of the internal process chamber when the pedestal and chuck are raised to an up position.

13. The wafer processing apparatus of claim 12, further including a transfer ring that is located between the top cover member and the rinse bowl member to provide at least a portion of the wall, where the wafer transfer opening is provided through the transfer ring, and the top cover member, transfer ring and the rinse bowl member are formed separately and are sealingly connected to one another.

14. The wafer processing apparatus of claim 13, wherein the first rotatable drive device is connected with the pedestal by a bracket, and the bracket is further connected with the first motion drive device for moving the first rotatable drive device and thus the chuck and the base portion of the pedestal between multiple positions between the top cover member and the rinse bowl member of the process chamber.

15. A method of processing a wafer within an apparatus having a sealable internal process chamber within which a wafer can be supported at multiple positions, wherein the internal process chamber is made up by a rinse bowl member that provides a chamber bottom, a top cover member that provides a chamber top and a wall between the rinse bowl portion and the top cover member that surrounds the internal process chamber, the wall also including a wafer transfer opening to permit a wafer to be selectively loaded into and removed from the internal process chamber, and the internal process chamber includes therein a wafer support chuck that is rotatably supported within the internal process chamber and that is displaceable in a first direction so as to be positionable within the internal process chamber in multiple positions between the top cover member and the rinse bowl member of the process chamber, and the chuck is operatively connected with a first motion drive device to move the wafer support chuck between multiple different positions within the internal process chamber including, said method comprising:
   loading a wafer onto the chuck while the chuck is in a wafer transfer position by transferring the wafer through the wafer transfer opening;
   activating the first motion drive device and thus moving the chuck to a different position than the wafer transfer position between the top cover member and the rinse bowl member; and
   performing a process step to the wafer while in the different position.

16. The method of claim 15, wherein the apparatus further includes a wafer transfer gate that is movably disposed with respect to the process chamber and which is movable between an opened position of the wafer transfer opening and a closed position of the wafer transfer opening, and the method further comprises the steps of opening the wafer transfer gate before loading a wafer onto the chuck and closing the gate to seal the internal process chamber prior to performing the process step.

17. The method of claim 16, wherein the wafer is a semiconductor wafer and the process step comprises a process applied to at least a surface of the semiconductor wafer.

18. The method of claim 17, wherein the chuck and thus the semiconductor wafer are moved to a liquid application position, and the process step comprises the application of a liquid to the surface of the semiconductor wafer.

19. The method of claim 18, wherein the chuck and thus the semiconductor wafer are moved to a vapor phase process position, and another process step is conducted to the wafer surface by exposing the wafer surface to a gas.

20. The method of claim 19, wherein the apparatus further includes a pedestal that is operatively connected with the first motion drive device so as to move along with the chuck, the pedestal including a base portion disposed within the internal process chamber and having a first sealing surface portion that is engageable with a second sealing surface portion that is provided within the internal process chamber, the method including the step of sealing the first and second sealing surfaces by raising the pedestal and chuck to an up position so as to seal off a portion of the internal process chamber.

* * * * *